(12) United States Patent
Ulyashin et al.

(10) Patent No.: US 9,461,123 B2
(45) Date of Patent: Oct. 4, 2016

(54) SEMICONDUCTING COMPONENT

(75) Inventors: Alexander G. Ulyashin, Oslo (NO); Smagul Karazhanov, Oslo (NO)

(73) Assignee: INSTITUTT FOR ENERGITEKNIKK, Kjeller (NO)

(*) Notice: Subject to any disclaimer, the term of this patent is extended or adjusted under 35 U.S.C. 154(b) by 199 days.

(21) Appl. No.: 12/867,070

(22) PCT Filed: Feb. 9, 2009

(86) PCT No.: PCT/NO2009/000045
§ 371 (c)(1),
(2), (4) Date: Aug. 11, 2010

(87) PCT Pub. No.: WO2009/102213
PCT Pub. Date: Aug. 20, 2009

(65) Prior Publication Data
US 2010/0319760 A1    Dec. 23, 2010

Related U.S. Application Data

(60) Provisional application No. 61/064,004, filed on Feb. 11, 2008.

(30) Foreign Application Priority Data

Feb. 12, 2008  (NO) .................................. 20080769

(51) Int. Cl.
| H01L 31/04 | (2014.01) |
| H01L 29/24 | (2006.01) |
| H01L 31/0328 | (2006.01) |
| H01L 31/072 | (2012.01) |

(52) U.S. Cl.
CPC ............ *H01L 29/24* (2013.01); *H01L 31/0328* (2013.01); *H01L 31/072* (2013.01); *Y02E 10/50* (2013.01)

(58) Field of Classification Search
CPC .................................................. H01L 27/1225
USPC ........................................................ 136/255
See application file for complete search history.

(56) References Cited

U.S. PATENT DOCUMENTS 4,710,786 A * 12/1987 Ovshinsky et al. .......... 136/258
5,719,076 A *  2/1998 Guha .............................. 438/96
(Continued)

FOREIGN PATENT DOCUMENTS

| CN | 1 483 724 | 3/2004 |
| EP | 0 233 613 | 8/1987 |

(Continued)

OTHER PUBLICATIONS

Sato, et al. Journal of Alloys and Compounds, 356-357 (2003) 494-496.*

(Continued)

*Primary Examiner* — Jennifer Michener
*Assistant Examiner* — Sadie White
(74) *Attorney, Agent, or Firm* — Nixon & Vanderhye P.C.

(57) ABSTRACT

This invention relates to an electronic semiconductive component comprising at least one layer (2,3) of a p-type or n-type material, wherein the layer of a said p- or n-type material is constituted by a metal hydride having a chosen dopant. The invention also relates to methods for producing the component.

13 Claims, 8 Drawing Sheets

(56) References Cited

U.S. PATENT DOCUMENTS 5,797,998 A * 8/1998 Wenham et al. ............ 136/255
6,146,608 A    11/2000 Todd et al.
6,319,565 B1   11/2001 Todd et al.

FOREIGN PATENT DOCUMENTS

FR  2 303 385     10/1976
WO  WO 99/27561   6/1999

OTHER PUBLICATIONS

Richardson, et al. Applied Physics Letters, 2001, vol. 78, No. 20, pp. 3047-3049.*

International Search Report for PCT/NO2009/000045, mailed May 6, 2009.
Norwegian Search Report for No. 20080769, mailed Sep. 11, 2008.
Myers et al., "Calculation of thermodynamic, electronic, and optical properties of monoclinic Mg2NiH4", *Journal of Applied Physics*, vol. 91, No. 8, Apr. 15, 2002, pp. 4879-4885.
ZH Karazhanov et al., "Semiconducting hydrides", *Europhysics Letters*, vol. 82, No. 1, Apr. 1, 2008, pp. 17006-p. 1-17006-p. 5.
ZH Karazhanov et al., "Similarity of electronic structure and optical properties of Mg2NiH4 and Si", *A Letters Journal Exploring the Frontiers of Physics*, vol. 82, May 2008, pp. 48004-p. 1-48004-p. 6.
Lupu et al, "Semiconducting Properties of $Mg_2NiH_4$", International Journal of Hydrogen Energy, vol. 12, No. 6, 1987, pp. 425-426.
Karazhanov et al, "Hydride electronics", Physica Status Solidi., vol. 204, No. 10, 2007, pp. 3538-3544.

* cited by examiner

| Compound | $E_g$ | Compound | $E_g$ | Compound | $E_g$ | Compound | $E_g$ |
|---|---|---|---|---|---|---|---|
| $MgH_2$ | 4.20 | $Na_3AlH_6$ | 3.00 | $CaB_2H_8$ | 5.10 | $SrMgNiH_4$ | 2.00 |
| $BeH_2$ | 5.51 | $K_3AlH_6$ | 3.00 | $CaAl_2H_8$ | 4.60 | $Yb_4Mg_3H_{14}$ | 3.13 |
| $LiAlH_4$ | 4.71 | $LiMgH_3$ | 3.98 | $Ba_6Mg_7H_{26}$ | 3.00 | $Sr_2Mg_3H_{10}$ | 3.00 |
| $LiBH_4$ | 6.94 | $NaMgH_3$ | 3.45 | $BaMgH_4$ | 2.32 | $LiH$ | 2.98 |
| $NaAlH_4$ | 5.04 | $KMgH_3$ | 2.67 | $Ca_{19}Mg_8H_{54}$ | 2.83 | $NaH$ | 3.79 |
| $KalH_4$ | 5.50 | $RbMgH_3$ | 2.81 | $Ca_4Mg_3H_{14}$ | 3.10 | $KH$ | 3.40 |
| $RbAlH_4$ | 5.00 | $CsMgH_3$ | 2.98 | $Ca_4Mg_4FeH_{67}$ | 1.30 | $RbH$ | 2.89 |
| $CsAlH_4$ | 4.80 | $LiBeH_3$ | 2.26 | $CaMgNiH_4$ | 3.72 | $CsH$ | 2.30 |
| $LiBH_4$ | 7.00 | $NaBeH_3$ | 1.79 | $Cs_2MgH_4$ | 3.77 | $CuH$ | 0.66 |
| $NaBH_4$ | 6.50 | $KBeH_3$ | 3.44 | $Cs_3MgH_5$ | 1.56 | $BaLiH_3$ | 1.23 |
| $KBH_4$ | 6.40 | $RbBeH_3$ | 3.27 | $K_2MgH_4$ | 3.57 | $CaCaH_3$ | 3.11 |
| $RbBH_4$ | 5.65 | $CsBeH_3$ | 3.22 | $LiMg_2RuH_7$ | 3.18 | $RbCaH_3$ | 3.28 |
| $CsBH_4$ | 5.35 | $BeAlH_5$ | 3.12 | $Mg_2RuH_4$ | 1.18 | $SrLiH_3$ | 1.86 |
| $LiGaH_4$ | 4.50 | $MgAlH_5$ | 2.48 | $Mg_3ReH_7$ | 2.75 | $α-AlH_3$ | 2.14 |
| $NaGaH_4$ | 4.71 | $CaAlH_5$ | 2.72 | $Rb_2MgH_4$ | 4.00 | $β-AlH_3$ | 3.50 |
| $KGaH_4$ | 5.00 | $SrAlH_5$ | 3.51 | $Rb_3MgH_5$ | 3.06 | $γ-AlH_3$ | 2.80 |
| $RbGaH_4$ | 5.00 | $BaAlH_5$ | 2.73 | $Rb_4Mg_3H_{10}$ | 3.52 | $Mg_2NiH_4-c$ | 1.30 |
| $CsGaH_4$ | 5.00 | $MgB_2H_8$ | 6.20 | $SrMg_2FeH_8$ | 1.65 | $Mg_2NiH_4-m$ | 1.65 |
| $Li_3AlH_6$ | 3.50 | $MgAl_2H_8$ | 4.40 | $SrMgH_4$ | 2.83 | $Mg_2CoH_5$ | 0.20 |

Fig. 1

| Compound | $E_g$ | $Nc$, (×10$^{19}$) | $Nv$, (×10$^{19}$) | $n_i$, (×10$^9$) | $m_{de}$ | $m_{dh}$ | $m_c$ | $m_h$ |
|---|---|---|---|---|---|---|---|---|
| Mg$_2$NiH$_4$-c | 1.3 | 0.58 | 0.11 | 0.03 | 0.38 | 0.12 | 1.02(Γ→X) 0.19(X→K) | 0.84(Γ→X) 0.71(Γ→L) |
| Mg$_2$NiH$_4$-m | 1.65 | 0.02 | 1.37 | 0.0002 | 0.04 | 0.67 | | 1.12(Γ→A) 0.93(Γ→Z) |
| Si, Theory | 0.70 | 0.40 | 0.06 | 0.62 | 0.29 | 0.08 | 1.09 | 0.27 (Γ→X), 0.79 (Γ→L) |
| Si, Exp | 1.12[a] | 2.90[a] | 3.10[a] | 12.00[a] | 1.10[a] | 1.15[a] | 1.08[b] | 0.217[c] (Γ→X) 0.541[d] (Γ→L) |

[a] Experiment.[3]

[b] Experiment.[4]

[c] Experiment.[5]

[d] k.p theory, semiempirical results.[6]

Fig. 8

SEMICONDUCTING COMPONENT

This application is the U.S. national phase of International Application No. PCT/NO2009/000045 filed 9 Feb. 2009 which designated the U.S. and claims priority to U.S. Provisional Application No. 61/064,004 filed 11 Feb. 2008 and NO Patent Application No. 20080769 filed 12 Feb. 2008, the entire contents of each of which are hereby incorporated by reference.

This invention relates to a semiconducting component and a method for producing such a component, more specifically it relates to the use and production of metal hydrides as semiconducting devices such as diodes or transistors.

Semiconductors have been commonly used in a wide range of applications for the last 50 years. Most of these are based on well known semiconducting materials such as Si or GaAs doped with different materials in order to adjust the band widths and thus the semiconducting properties of the materials, e.g. for providing p- or n-type conductivity and combinations of such for producing diodes, transistors etc.

A problem with the industry is that even the most common material Si, is a limited resource and the price for Si wafers for semiconductor production has been fairly constant for years. Thus large structures such as solar cells are expensive, and as the production of silicon is energy consuming the environmental gain of solar cells is limited.

Thus there is a need for alternative materials which can be used in semiconductive devices, especially large structures such as solar cells. Recently it has been discovered that some metal hydrides have semiconductive properties, as discussed in the article by S. Karazhanov, P. Ravindran, P. Vajeeston, A. Ulyashin, "Hydride Electronics", Phys. Stat. Sol. (a) 204 (2007) p. 3538-3544. As discussed in this article the metal hydrides to date has been aimed at fast absorption and desorption of hydrogen, which is advantageous when used as storage means for hydrogen but a disadvantage for electronic applications where stability is an important issue.

The use of hydrogenated materials in solar cells and other electronic devices is well know as such, and some examples are found in the following publications, but mostly used to avoid disadvantages of silicon based solutions.

EP0233613 by C. R. Dickson 1987 Aug. 26 discusses Si (semiconductor) based hydrides and it is related to the discovery of "Giant Micro-electronics", which is about applications of hydrogenated amorphous silicon (a-Si:H) in semiconductor electronics. Nowadays some other hydrogenated semiconductors such as, e.g., a-Si:H, Si2N3H, etc., are widely used in electronic devices, but they have the same disadvantages as other silicon based solutions.

Patent application WO 9927561A by M. Todd et. Al. 1999 Jun. 3 provides solution of the problem as to how to stabilize a hydride to make it suitable for electronic device applications. CN 1483724 by T. Utang et. al. 2004 Mar. 24 discusses hydrogen containing polymer Tris(8-hydroxyquinolinato) aluminum obtained by using the hydride $LiAlH_4$.

FR 2303385 A by J. Meuleman 1976 Oct. 1 discusses a detector consisting of a p-i-n diode from the Si/Hydride device structure where a $LiAlH_4$ is deposited on a Si substrate. One disadvantage of Si(Li) detectors is that they have to be stored in liquid nitrogen or the lithium will diffuse out of the depletion layer.

This object is thus to provide a cost effective solution for making semiconductive devices and is obtained by a method and component as mentioned above and characterized as specified in the accompanying claims.

The invention will be described below with reference to the accompanying drawings, illustrating the invention by way of examples.

FIG. 1 illustrates table over band gap ($E_g$ (in eV)) of a number of metal hydrides.

FIG. 2. illustrates the band dispersion for Si, $Mg_2NiH_4$-c, and $Mg_2NiH_4$-m. Fermi level is set at zero energy.

FIG. 3. illustrates the total density of states (DOS) for Si, $Mg_2NiH_4$-c, and $Mg_2NiH_4$-m. The Fermi level is set to zero.

FIG. 4. illustrates the orbital and site projected DOS for DOS for Si and $Mg_2NiH_4$-c. Fermi level is set at zero energy.

FIG. 5. illustrates the total DOS for $Mg_2NiH_4$-c doped with $Al_{Mg}$ and $Li_{Mg}$ along with that for bulk $Mg_2NiH_4$-c. The Fermi level is set to zero.

FIG. 6. illustrates the optical spectra for $Mg_2NiH_4$-c doped with $Li_{Mg}$ and $Al_{Mg}$ as compared to those for undoped $Mg_2NiH_4$-c.

FIG. 8 shows a table over effective masses (in units of the electron rest mass $m_0$) of electrons $m_c$ and holes $m_h$ for some hydrides, conventional semiconductors and transparent conductive oxides (TCOs).

Analysis of literature and our studies of electronic structure and optical properties of hydrides with/without defects and impurities shows that some hydrides are insulators with large fundamental band gap (see FIG. 1). FIG. 1 shows the fundamental band gap of a number of metal and complex hydrides: 1-5. $MgH_2$; $BeH_2$; $LiAlH_4$; $NaAlH_4$; $NaAlH_4$; 6-10. $KalH_4$; $RbAlH_4$; $CsAlH_4$; $LiBH_4$; $NaBH_4$; 11-15. $KBH_4$; $RbBH_4$; $CsBH_4$; $LiGaH_4$; $NaGaH_4$; 16-20. $KGaH_4$; $RbGaH_4$; $CsGaH_4$; $Li_3AlH_6$; $Na_3AlH_6$; 21-25. $K_3AlH_6$; $LiMgH_3$; $NaMgH_3$; $KMgH_3$; $RbMgH_3$; 26-30. $CsMgH_3$; $LiBeH_3$; $NaBeH_3$; $KBeH_3$; $RbBeH_3$; 31-35. $CsBeH_3$; $BeAlH_5$; $MgAlH_5$; $CaAlH_5$; $SrAlH_5$; 36-40. $BaAlH_5$; $MgB_2H_8$; $MgAl_2H_8$; $CaB_2H_8$; $CaAl_2H_8$; 41-45. $Ba_6Mg_7H_{26}$; $BaMgH_4$; $Ca_{19}Mg_8H_{54}$; $Ca_4Mg_3H_{14}$; $Ca_4Mg_4FeH_{63}$; 46-50. $CaMgNiH_4$; $Cs_2MgH_4$; $Cs_3MgH_5$; $K_2MgH_4$; $LiMg_2RuH_6$; 51-55. $Mg_2RuH_4$; $Mg_3ReH_7$; $Rb_2MgH_4$; $Rb_3MgH_5$; $Rb_4Mg_3H_{10}$; 56-60. $SrMg_2FeH_8$; $SrMgH_4$; $SrMgNiH_4$; $Yb_4Mg_3H_{14}$; $Sr_2Mg_3H_{10}$; 61-66 LiH; NaH; KH, RbH; CsH; CuH; 67-70 $BaLiH_3$; $CaCaH_3$; $RbCaH_3$; $SrLiH_3$, 71-76 α-$AlH_3$, β-$AlH_3$, γ-$AlH_3$. $Mg_2NiH_4$-c, $Mg_2NiH_4$-m, $Mg_2CoH_5$. With band gaps less than approximately 3 eV the materials are opaque while they are transparent above 3 eV. The most desirable range is between 3 and 4 eV.

The calculated band gaps presented in FIG. 1 are underestimated because of the well known deficiency of calculation method, density-functional theory (DFT). So, real band gaps are expected to be larger than those presented in FIG. 1. Analysis of FIG. 1 shows that $Ca_4Mg_4FeH_{63}$, $Mg_2RuH_4$, CuH, $BaLiH_3$ posses small band gaps <1.5 eV. Often, small band gap solids posses the feature of easy bipolar doping, i.e. to be doped with shallow donor and acceptors providing n- and p-type conductivities, respectively. One can design from such solids p-n-junction. Well dispersed nature of bottom-most conduction band and top-most valence bands show that these materials are expected to show good electrical conductivity. Such hydrides can present interest for electronic device applications, say as p-n junction based devices (solar cells, photodetectors, buffer layers, etc.).

Figure 2:
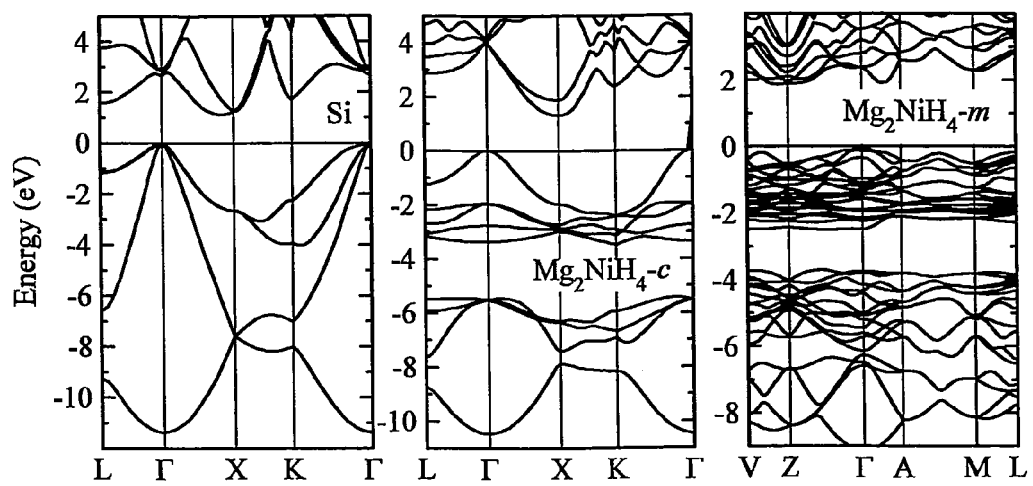

Band structure studies for some of the hydrides (FIG. 2) show that bottom-most CB and topmost VB of Si, $Mg_2NiH_4$-c, and $Mg_2NiH_4$-m are well dispersive. Consequently, carrier transport through conduction band (CB) and/or valence band (VB) for these hydrides is possible.

These analyses show that band structure of hydrides posses the feature required for current transport like semiconductors.

Figure 3:
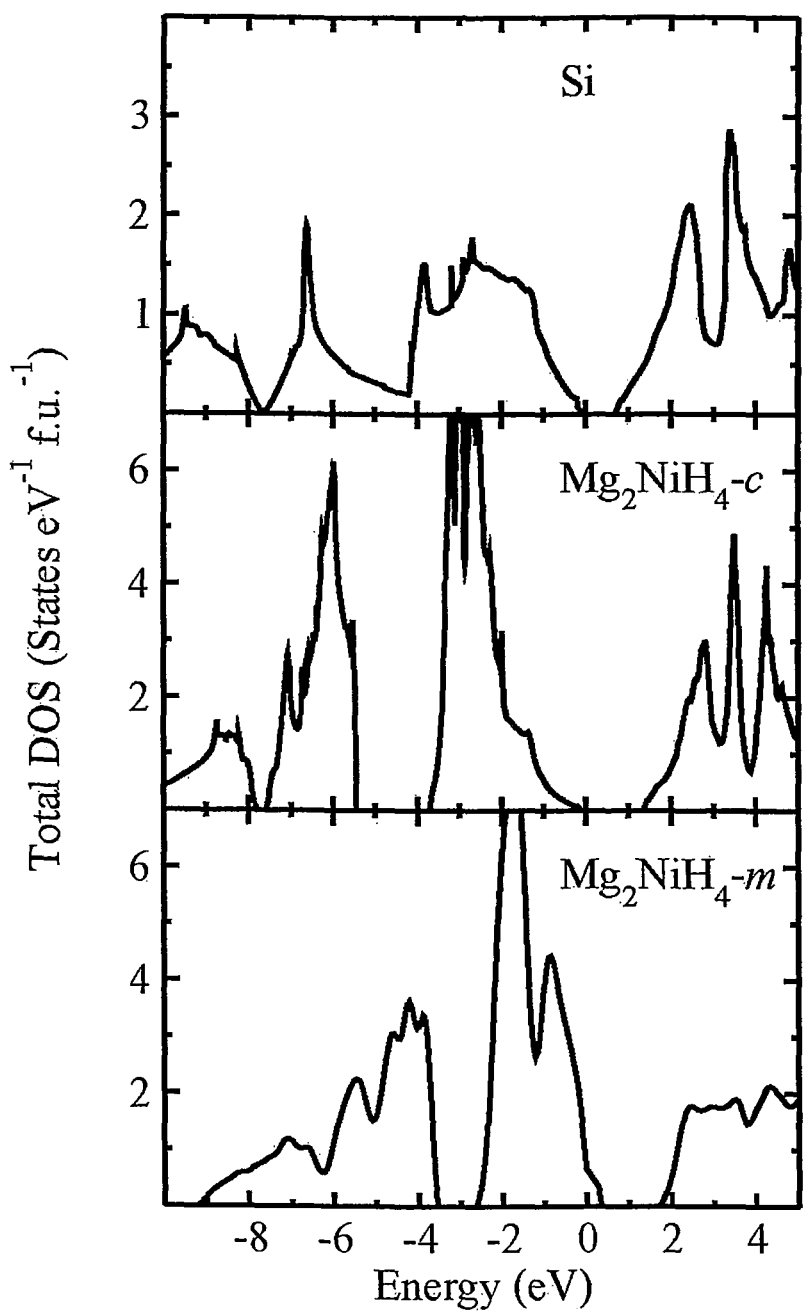

Total density of states (DOS) N(E) has been calculated (FIG. 3). Analysis shows that the topmost VB is sufficiently wide and it does not present isolated sharp peaks. This feature indicates to significant role of covalence in chemical bonding, which is favorable for current transport through these compounds. Knowing the total density of states (DOS) N(E) calculated by DFT, effective DOS in the conduction band (CB) Nc and in the valence band (VB) Nv have been estimated $$Nc = \frac{1}{V_0} \int_{Ec}^{\infty} e^{-\frac{Ec-E}{kT}} N(E) dE, \quad (1)$$

$$Nv = \frac{1}{V_0} \int_{-\infty}^{Ev} e^{-\frac{E-Ev}{kT}} N(E) dE, \quad (2)$$

which have been used to calculate intrinsic carrier concentration $n_i$ $$n_i = \sqrt{Nc \times Nv} \times e^{-\frac{E_g}{2kT}} \quad (3)$$

Here E is the energy, Ec and Ev are the energies corresponding to bottommost CB and topmost VB. k is the Boltzmann constant and T is the temperature. $V_0$ is the volume of the unit cell and $E_g=Ec-Ev$ is the fundamental band gap. Knowledge of $n_i$ allows to estimate diffusion potential of the p-n junction with concentration of shallow donors $N_d$ and shallow acceptors $N_a$ $$V_D = \frac{kT}{q} \ln\left(\frac{N_a N_d}{n_i^2}\right), \quad (4)$$

which is one of the important parameters of semiconductor p-n junction based devices. Using the values of N(E) and Eq. (1)-(3), effective DOS for CB (Nc) and VB (Nv) as well as intrinsic carrier concentration ($n_i$) have been calculated for Si, $Mg_2NiH_4$-c, and $Mg_2NiH_4$-m for T=300 K (Table II). These values are close to those of Si. The small difference can be related to peculiarities of the band structure and fundamental band gap.

Figure 4:
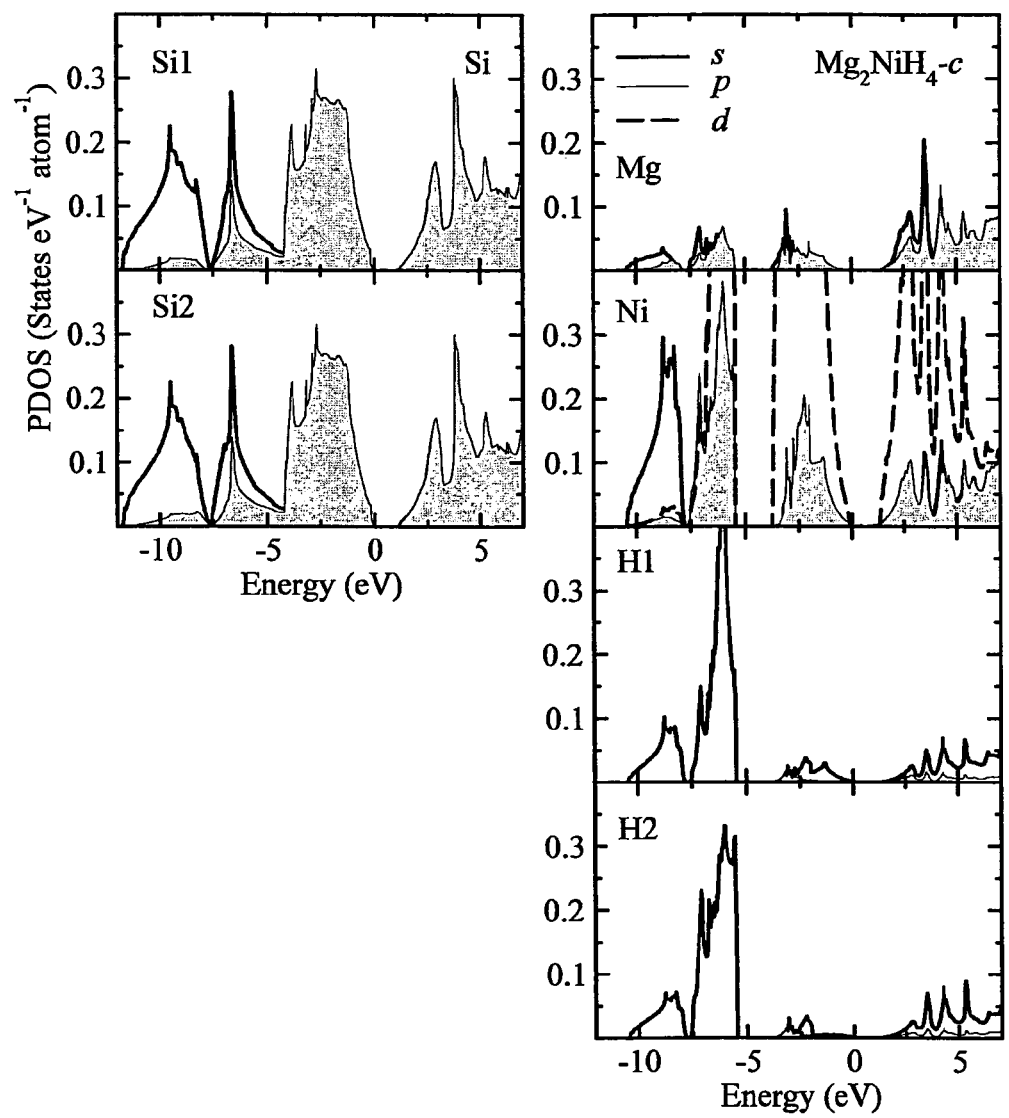

The orbital and site projected density of states (PDOS) and fat band analysis has been performed. FIG. 4 presents PDOS for Si and $Mg_2NiH_4$-c. Analysis showed that not only the bottommost CB, but also the topmost VB of most of the hydrides are mainly contributed from s-electrons. This is the distinguishing feature of hydrides compared to conventional semiconductors and TCOs where the topmost VB are commonly originated from p-/d-electrons and bottommost CB—from s-electrons.

One of the parameters characterizing transport properties of solids is carrier effective masses. Effective masses have been calculated for Si and $Mg_2NiH_4$-c, and $Mg_2NiH_4$-m as illustrated in the table in FIG. 8. Analysis shows that the effective masses of hydrides are of the same order as those of the well known semiconductors such as Si and GaAs, TCOs ZnO and $In_2O_3$. The results indicate that electrical conductivity of hydrides can be the same as that of semiconductors and TCOs.

Application of a material as electric and optoelectronic devices critically depends on dopability, which can be limited by the following three main factors:
(i) the desired shallow-level impurity may have a low solubility;
(ii) even if it has good solubility, but its transition energy can be deep, so that at operating temperature the defect can not be ionized;
(iii) even if the shallow level impurity posses good solubility, upon shifting the Fermi energy oppositely charged native defects or defect-impurity complexes can be formed.

In this specification the issue (ii) of whether an impurity form shallow energy level in the band gap of hydrides.

Figure 5:
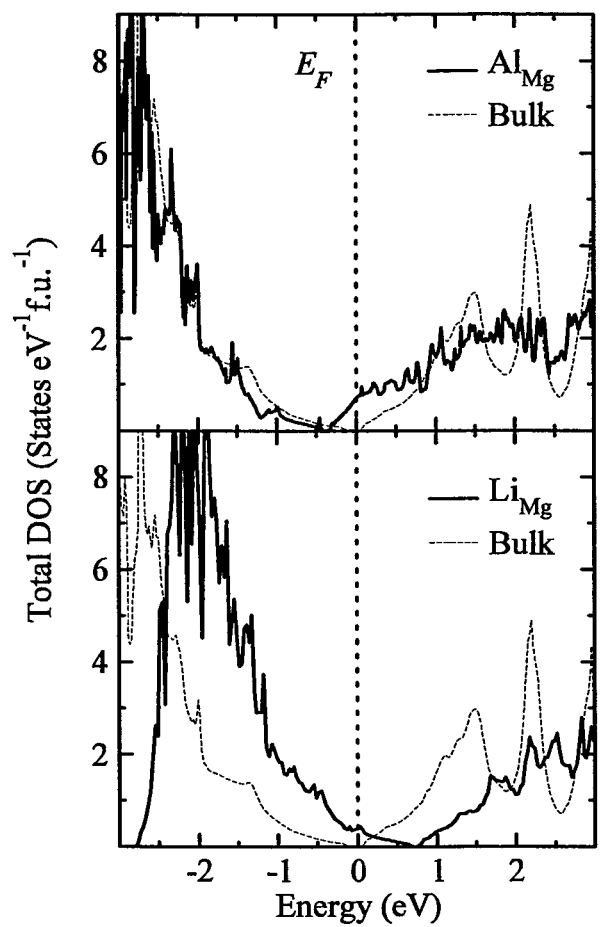

As the shallow-level defects and impurities can be the source for electrical conductivity of semiconductors, we have calculated electronic structure and optical properties of several hydrides. FIG. 5 presents total DOS for $Mg_2NiH_4$-c with $Al_{Mg}$ and $Li_{Mg}$. We found that $Al_{Mg}$ (FIG. 5) form states below the bottommost part of the CB of $Mg_2NiH_4$-c. These shallow-donor-states are not isolated from the CB and can contribute to the n-type electrical conductivity. The defects such as $Li_{Mg}$ form shallow acceptor states and can contribute to p-type electrical conductivity (FIG. 5).

Figure 6:
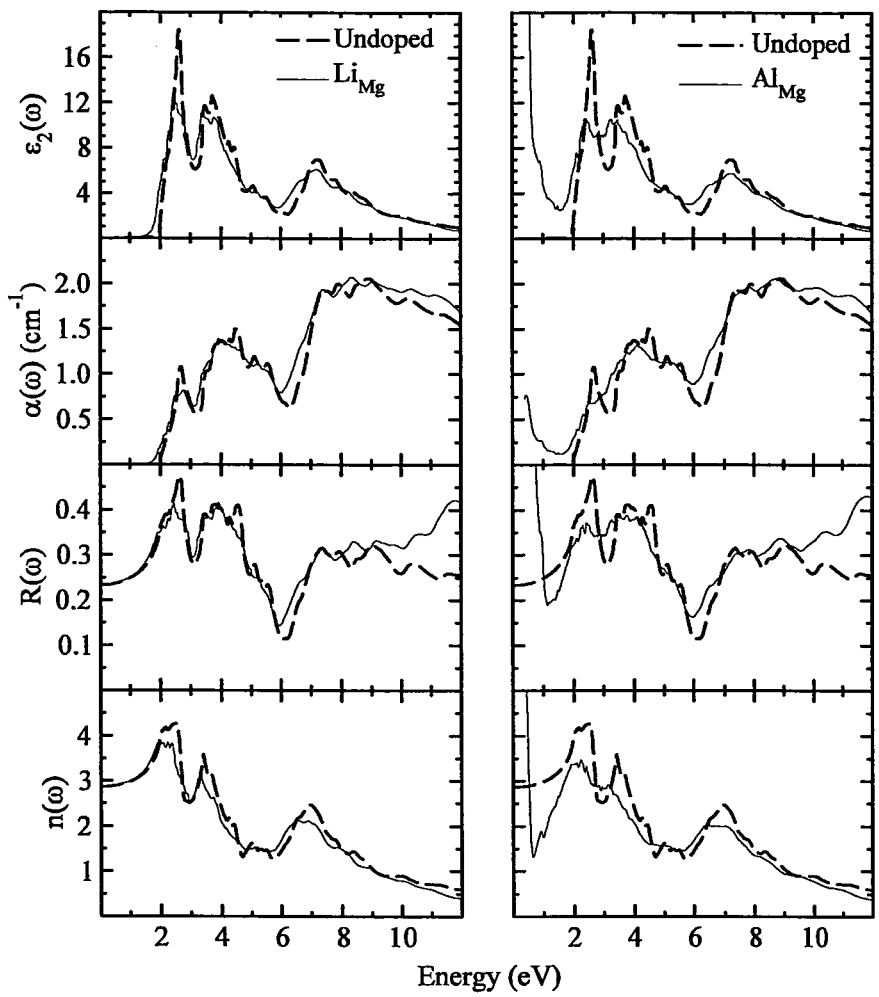

Doping can affect not only conductivity but also transparency. In order to establish this viewpoint we have studied absorption and reflectivity spectra of $Mg_2NiH_4$-c with $Al_{Mg}$ and $Li_{Mg}$ (FIG. 6). From FIG. 5 it is seen that $Al_{Mg}$ and $Li_{Mg}$ doped $Mg_2NiH_4$-c is not transparent. The reason is that not only the fundamental, but also the second band gap of the hydride, which is the energy difference between the nearest two bottommost CB, is not sufficiently large. To consider these hydrides as TC materials the second band gap should be >3.1 eV.

In TCOs it is well known that one can easily bring in n-type conductivity, but the introduction of p-type conductivity is problematic. It follows from our results that high p-type doping level in hydrides shall not loose transparency, but can provide good conductivity, whereas high n-type doping leads to loss in transparency. This is one of the distinguishing features between TCOs and hydrides. The calculated formation energies for the Li(Al) doped $Mg_2NiH_4$-c is −0.20(+1.57) eV, which shows that the configuration with Li is stable, whereas that with Al is not stable.

Knowledge of intrinsic carrier concentration and concentration of shallow acceptors and donors allows one to calculate by Eq. (4) diffusion potential $V_D$. Below we perform such estimation for $Mg_2NiH_4$-c. Assuming Nd~$10^{20}$ cm$^{-3}$ and Na~$10^{15}$ cm$^{-3}$ one can find that $V_D$~1.06 V.

As can be seen from FIG. 1 large number of hydrides possess wide band gap and therefore can be used as transparent windows for wide variety of electronic devices such as solar cells, light emitting diodes etc. Thus, the wide band gap hydrides can be regarded as an alternative to such conventional transparent microelectronic materials as $SiO_x$, $SiN_x$ or $SiN_x$:H. Distinct from these transparent windows, hydrides have the advantage to provide good passivation of interfaces in semiconductor devices similar to that by the a-Si:H due to high concentration of hydrogen in their structure. More systematic investigations are necessary to prove this statement.

Although wide band gap hydrides can be conductive, as it was shown above, the doping limit for each concrete hydride material is not known yet and has to be studied systematically. In case if an effective high level doping and electrical conductivity can be realised for some of them along with transparency to the visible part of the solar spectra, they can be regarded as alternative to TCO materials. Nevertheless, at this stage of investigations it is possible to claim already that hydrides are more flexible materials than $SiN_x$ or TCOs, which are widely used as antireflection coatings in solar cells. As it is well known, optical properties of $SiN_x$ and TCOs and passivation of interface states shall be controlled by modulation of the nitrogen or oxygen stoichiometry, which is rather problematic. Upon using hydrides these features can relatively easily be controlled by hydrogen content only. Consequently, formation of nano-dots and other nano-structures in hydrides can be realized more easily than those in $SiN_x$ and TCOs. Furthermore, structural and morphological modifications of hydrides can be done at much lower temperatures and pressures than $SiN_x$ and TCOs. Hence, hydrides can be more suitable for low temperature synthesis technologies.

The usage of TCOs in some devices results in the formation of an intermediate oxide layer, large band-offset, and defect states, which can limit the device performance. If hydrides would be used instead of the TCOs, then no oxide layer would be formed and there is no need in using buffer layer. Large band-offset can be prevented by reducing the band gap of the hydrides, which is much easier than that in oxides. Furthermore, hydrogen diffusion from hydrides into semiconductors can be useful to passivate defect states at the interface and increase their conductivity those are important for improving the device performance. Hydrides can also be regarded as a natural alternative to $SiN_x$ and TCOs in case of any low temperature technology.

Smaller band gap hydrides with well dispersive bottommost conduction band and topmost valence band can be useful to replace semiconductor devices such as, say, solar cells. From this point of view, hydrides can be regarded as novel class of solar cells. The crystalline nature and light weight of hydrides, as well as small concentration of defects between active solar cell and TCO present interest for third generation photovoltaics. World wide lot of attention is currently focused on developing environmentally friendly technologies, alternative energy sources, improving the performance of solar cells etc. and our finding is directly relevant to these activities. It has to be noted that hydrides in most cases are much lighter than conventional semiconductors, and hydrogen is the most abundant element in the universe. Consequently, hydrides are of great interest for terrestrial and space applications of solar cells, and also hydrides have large potential for applications in bio-compatible semiconducting devices.

Figure 7:
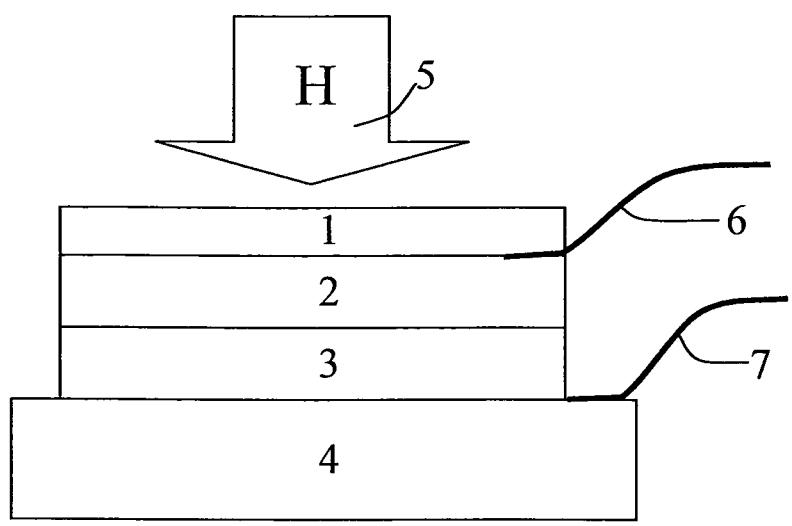
FIG. 7 illustrates a schematic cross section of the component according to the invention.

The component according to the invention is illustrated in FIG. 7 and is preferable produced by positioning at least one metal layer 2,3 on a substrate 4, and a capping layer 1 on top of the metal layer 2,3. The metal layer is made from a metal and doped with a chosen dopant which when hydrogenated will have a chosen semiconducting characteristic as discussed in the theory above.

After the deposition of the capping layer 1 the component is hydrogenated by subjecting the component to a gas flow 5 comprising hydrogen, as will be discussed more in detail below. Resulting from this is a component comprising a capping layer 1, a doped metal hydride layer 2,3 and a substrate. In the example illustrated in FIG. 1 two metal hydride layers 2,3 are shown, for example providing a p-n junction, i.e. one layer with p-type conduction and one layer with n-type conduction.

A principle scheme for fabrication of individual n- or p-type metal hydride layers or a p-n (n-p) junction based metal hydride structures can be described as follows:

(i) Deposition of an individual metal layer with an appropriate metal composition (co-doped by some elements, see examples below), which provides formation of the p-type hydride after the hydrogenation. This process can be realized using any sputtering method: magnetron, thermal evaporation, e-beam evaporation etc. as well as by any chemical deposition methods. In case of a sputtering process, deposition can be done from one (one target consists of a required composition) or several individual targets (co-sputtering process). Deposition can be done on any substrate (metal, ceramics, semiconductor, polymer etc.) in a temperature interval from room-temperature up to the minimum value of the melting temperature of the sputtered metal composition or the substrate. The thickness of the layer, depending on the applications, can be different: from few nm to few μm.

In case, of fabrication of a n-p junction metal hydride structure, one addition metal layer has to be deposited as described below.

(ii) The same sputtering process can be applied for deposition of a metal layer (co-doped) with an appropriate composition, which provides formation of an n-type layer after the hydrogenation (see examples below).

(iii) For the formation of a transistor-like structure (n-p-n or p-n-p), deposition of a third corresponding layer after the process (ii) is required.

(iv) After processes described in (i), (ii) and (iii) a capping Pd or Ni layers with thickness 3-20 nm have to be deposited on an individual metallic layer (after process (i)) or on a metallic stack (after processes (ii) and (iii)). The Pd(Ni) layers serve as catalytic ones to provide a hydrogenation of metallic based structures to convert them into metal hydrides. Thus, these layers work as a membrane that allows passing of hydrogen through them towards to metallic layers with different composition.

(v) The hydrogenation process can be performed by exposing the final films to a dry gas stream (pure $H_2$ or $H_2$ containing forming gas (a mixture of $H_2$ with a noble gas)). Some details of the dry hydrogenation are given in article by T. J. Richardson, J. L. Slack, R. D. Armitage, R. Kostecki, B. Farangis, M. D. Rubin, "Switchable mirrors based on nickel-magnesium films", Appl. Phys. Lett. Vol. 78, No 20 (2001) p. 3047-3049.

The hydrogenation process can be done at temperatures between room temperature and the stability temperature of a given metal hydride.

Moreover, the hydrogenation can be performed in an electrolyte solution, as described in an article by E. S. Matveeva, R. J. Ortega Ramiro, A. Sanchez Bolinchez, C. Ferrer Limenez, V. P. Parkhutik, "Design and operational conditions of small electrochemical cell for optical switching employing hydrogenation of Pd/Y structure", Sensors and Actuators B 84 (2002) p. 83-90. In this case hydrogenation can be performed at temperatures between room temperature and 100° C.

The hydrogenation has to be done up to the stage, at which a given metal composition or whole metal multi-layer structure is converted into a semiconductor ones completely.

The conversion (hydrogenation) time depend on the composition of each individual metal layer, thickness of metallic layers, hydrogenation temperature, hydrogen (forming gas) pressure etc.

An alternative production method may be performed by growing the layers as hydrides, which will reduce the stress in the material which occurs when it is loaded with hydrogen after the deposition. A more detailed description is given in the thesis of Ingrid A. M. E. Giebels "Shining light on magnesium based switchable mirrors" ISBN 90-9018547-X, section 2.2.1 where a GdMg—$H_5$ layer is produced by co-sputtering of the metals in a hydrogen/argon atmosphere at room temperature. In this case also the capping layer may be omitted during production. The abovementioned thesis in sections 2.2.2 and 2.2.3 also discloses other production methods incorporating In-Situ and Ex-Situ hydrogen loading. A combination of the production methods may also be contemplated, where the layers are grown as hydrate metals, and additional hydrogen are loaded afterward. This is discussed in section 5.14 in the thesis of Ruud Westerwaal, "Growth, microstructure and hydrogenation of Pd-catalyzed complex metal hydride thin films", ISBN-978 90 8659 071 1.

Due to a possibility to fabricate metal hydrides with any desirable band gap, which depends on the composition (including the hydrogen content) the individual n- or p-type metal hydrides layers can be utilized for instance as buffer layers for heterojunction devices, such as solar cells. In this case the device structures look like follows:

(i) Antireflection coating/Pd/Ni) 1/n-(p-type) metal hydride 2/p-(n-type)solar cell base: (Si, In—Ga—Cu—Se(S), etc) 3/back side metallization 7;

or (ii) Antireflection coating/Pd/Ni) 1/n-(p-type) metal hydride 2/p-(n-type)solar cell base: (Si, In—Ga—Cu—Se(S), etc) 3/p-(n-type) metal hydride (not shown)/Pd(i) 4/back side metallization 7;

The n-type/p-type metal hydride stack can also be utilized as a diode, which is a basic structure of several microelectronic devices, including solar cells. In the later case the metal hydride solar cell structures look as follows: Antireflection coating 1/n-type(p-type) metal hydride (emitter) 2/p-type(n-type) metal hydride solar cell base 3/Pd(Ni) 4/back side metallization 7;

A number of different metal hydrides may be used as n- and p-type semiconductors. Some examples are mentioned below:

$Mg_2NiH_4$-c
- n-type conductivity provided by Al doping, which being in a Mg site leads to the formation of $Mg_2NiH_4$-c:AlMg composition. Concentration of Al atoms as the Mg substitution dopants for the $Mg_2NiH_4$-c composition can be varied from 1015 to 1022 atom/cm3.
- p-type conductivity provided by Li in Mg substitution position. Concentration of Li atoms as the H substitution dopants for the $Mg_2NiH_4$-c composition can be varied from 1015 to 1022 atom/$cm^3$.

$AlH_3$ (see the abovementioned article by S. Karazhanov et al, published in Phys. Stat. Sol. "hydride electronics")
- n-type conductivity provided by group-IV/-II atoms (C, Si, etc./Be, Mg, etc.) substituting Al.
- p-type conductivity provided by Ca atom doping. In this case Ca substitutes Al.
- The concentration of all foreign atoms, which provide the n- or p-type conductivity in $AlH_3$ structure, can be varied from 1015 to 1022 atom/$cm^3$.

Other combinations of metals and dopants may be contemplated, e.g. combinations of the $AlH_x$ and $NgNiH_x$ materials mentioned above, thus providing any combinations of n-p, p-n, p-p or n-n junctions, as well as three layered components such as n-p-n and p-n-p constituting transistors.

The materials are chosen depending on their stability, especially related to temperature and the band gap as well as the compatibility with other materials in the component and connected instruments and conductors. It is also possible to use materials having amorphous properties with the selected concentrations of hydrogen.

Electrical couplings to conductor leads 6,7 for utilizing the component in an electronic system may also be of different types depending on the compatibility. In general there it is an advantage related to the use of metal hydrides as semiconductors that they provide good electrical contact with other materials and conductor leads. The electrical coupling points may be chosen e.g. to the top metal hydride surface 2 and to the substrate 4.

The substrate 4 is made by any material being compatible with the materials of the deposited layers, such as metal, ceramic, glass, polymers, etc, the choice also depending on the need for e.g. an electrically conductive substrate or for providing electrical conductors on or through the substrate. The substrate 4 may also be a metal or metal to be hydrogenated through the production process, thus being part of the active component.

Thus the component according to the inventions involves a layered structure comprising at least one p- or n-type metal hydride. In the preferred embodiment the component incorporates at least two layers, e.g. providing a p-n junction or three layers providing a n-p-n or p-n-p junction, but other solutions may be contemplated, depending on the use, for example an n-n' configuration.

Usually the component will include a protective top layer, e.g. a TCO and a lower substrate. Between the layers amorphous layers of metal hydrides or silicon may be used, so as to act as stress relieves or buffer layers, but this may not be necessary if two layers are compatible. A possible component according to the invention for use in solar cells could thus be comprised from the bottom and up by a conductive metal substrate 4, a p-type metal hydride layer 3, an n-type metal hydride layer 2, and a TCO 1 on top, with conductors 5,6 connected to the TCO layer 1 and metal substrate 4. Depending on the available materials and their band gaps other structures may also be possible, as mentioned above constituting p-n-p structures etc.

To summarize the invention thus relates to an electronic semiconductive component comprising at least one layer of a p-type or n-type material, wherein said p- or n-type material is constituted by a metal hydride having a chosen dopant. According to the preferred embodiment the component comprises both a p-type and an n-type material constituting a p-n junction, wherein at least one of said p- and n-type materials is constituted by a metal hydride having a chosen dopant. Thus effectively constituting a diode, which can be used as a solar cell.

A number of material may be used for making the n-type material in the component, such as having at least one following materials $Mg_2NiH_4$-c with Al atom doping in a concentration of $10^{15}$ to $10^{22}$ atoms/$cm^3$, $MgH_2$ with Al atom doping in a concentration of $10^{15}$ to $10^{22}$ atoms/$cm^3$ or $MgH_2$ with Cs atom doping in a concentration of $10^{15}$ to $10^{22}$ atoms/$cm^3$. Another possible n-type material is made from $AlH_3$ with atom doping from group IV/II atoms, eg. C, Si, Be, Mg etc in a concentration of $10^{15}$ to $10^{22}$ atoms/$cm^3$.

Similarly p-type materials may for example be provided by using a material made from $Mg_2NiH_4$-c with Li atom doping in a concentration of $10^{15}$ to $10^{22}$ atoms/$cm^3$, $MgH_2$ with Li atom doping in a concentration of $10^{15}$ to $10^{22}$ atoms/$cm^3$, or at least one following materials $AlH_3$ with Ca atom doping in a concentration of $10^{15}$ to $10^{22}$ atoms/$cm^3$.

In addition to the p-n junction a third layer may be added, for example making a p-n-p or n-p-n device.

The component may be produced in different ways for example by ex-situ or in-situ deposition or sputtering techniques. The ex-situ deposition method comprising the steps of depositing at least one layer constituted by a chosen metal having a chosen dopant on a substrate, said dopant providing a n- or p-type conductivity after hydrogenation, providing a capping layer on said at least one layer, and exposing the layers and capping to a gas stream containing a chosen fraction of hydrogen. This method may also include depositing of two metal layers, one of which providing an n-type semiconductor after hydrogenation and the second providing a p-type semiconductor after hydrogenation, thus providing a p-n junction, and depositing a third metal layer providing a second p-n or n-p junction after hydrogenation.

The in-situ production method may comprise the steps of depositing at least one first layer constituted by a chosen metal having a chosen dopant on a substrate, the deposition being performed by a sputtering process in an atmosphere constituted by hydrogen and a nobel gas, e.g. argon, thus depositing a hydrogenated doped metal layer, the dopant providing a n- or p-type conductivity.

As with the ex-situ method this may also include a second step of depositing a second layer with a second dopant being different from said first dopant, as well as a third step adding a third layer. A combination of the two methods may also be used by including a step of depositing a capping layer and exposing said component to a gas stream containing a chosen fraction of hydrogen for additional hydrogen loading of the material.

The invention claimed is:

1. Electronic semiconductive component comprising at least one layer of a p-type and n-type material, said component comprising a p-type and an n-type material constituting a p-n junction, wherein the p- and n-type materials constituting the p-n junction are semiconductive metal hydrides having a chosen dopant.

2. Component according to claim 1, wherein the p-type material is made from $Mg_2NiH_4$-c with Li atom doping in a concentration of $10^{15}$ to $10^{22}$ atoms/cm$^3$, or $MgH_2$ with Li atom doping in a concentration of $10^{15}$ to $10^{22}$ atoms/cm$^3$.

3. Component according to claim 1, wherein the p-type material is made from $AlH_3$ with Ca atom doping in a concentration of $10^{15}$ to $10^{22}$ atoms/cm$^3$.

4. Component according to claim 1, wherein the n-type material is made from $Mg_2NiH_4$ with atom doping from one or more group I and/or group III atoms in a concentration of $10^{15}$ to $10^{22}$ atoms/cm$^3$.

5. Component according to claim 1, also including a third material of a p-type providing a p-n junction with said n-type material, the component thus being a p-n-p device.

6. Component according to claim 1, also including a third material of a n-type providing a p-n junction with said p-type material, the component thus being a n-p-n device.

7. A solar cell comprising a component according to claim 1.

8. Method for producing a component according to claim 1 including a semiconducting metal hydride, comprising the steps of depositing at least one layer constituted by a chosen metal having a chosen dopant on a substrate, said dopant providing a n- or p-type conductivity after hydrogenation, providing a capping layer on said at least one layer, and exposing the layers and capping to a gas stream containing a chosen fraction of hydrogen.

9. Method according to claim 8, wherein it includes depositing of two metal layers, one of which providing an n-type semiconductor after hydrogenation and the second providing a p-type semiconductor after hydrogenation, thus providing a p-n junction.

10. Method according to claim 8, wherein it includes depositing a third metal layer providing a second p-n or n-p junction after hydrogenation.

11. Method for producing a component according to claim 1 including a semiconducting metal hydride, comprising the steps of depositing at least one first layer constituted by a chosen metal having a chosen dopant on a substrate, the deposition being performed by a sputtering process in an atmosphere constituted by hydrogen and a noble gas, thus depositing a hydrogenated doped metal layer, the dopant providing a n- or p-type conductivity.

12. Method according to claim 11, including a second step of depositing a second layer with a second dopant being different from said first dopant.

13. Method according to claim 11, including a step of depositing a capping layer and exposing said component to a gas stream containing a chosen fraction of hydrogen for additional hydrogen loading of the material.

* * * * *